United States Patent [19]

Okaya et al.

[11] Patent Number: 5,625,534

[45] Date of Patent: Apr. 29, 1997

[54] PORTABLE COMPUTER HAVING A DATA CARD READER APPARATUS ASSOCIATED THEREWITH

[75] Inventors: Ken P. Okaya; Bryan Howell, both of Austin, Tex.

[73] Assignee: Dell Computer Corporation, Austin, Tex.

[21] Appl. No.: 440,284

[22] Filed: May 12, 1995

[51] Int. Cl.$^6$ .................................. G06F 1/16; H05K 5/00
[52] U.S. Cl. ..................... 361/686; 361/737; 364/708.1
[58] Field of Search .............................. 361/686, 737, 361/748; 348/552; 364/708.1; 235/472

[56] References Cited

U.S. PATENT DOCUMENTS

| | | | |
|---|---|---|---|
| 4,602,351 | 7/1986 | Shimamura et al. | 365/52 |
| 5,475,441 | 12/1995 | Parulski et al. | 348/552 |
| 5,497,464 | 3/1996 | Yeh | 395/200.01 |

*Primary Examiner*—Leo P. Picard
*Assistant Examiner*—Jayprakash N. Gandhi
*Attorney, Agent, or Firm*—Hitt Chwang & Gaines, P.C.

[57] ABSTRACT

The present invention provides a personal computer comprising a main chassis having an exterior wall forming, in part, an interior portion of the personal computer. The exterior wall has a data card slot formed therein and is configured to receive a data card therethrough. The interior portion contains data processing circuitry for processing data recorded on a data card. A data card reader is positioned within the interior portion and has a reading head positioned adjacent a first end of the data card reader for linearly reading the data when the data card is received through the slot. Further, the data card reader has a second end electrically connectable to the data processing circuitry for transmitting the data to the data processing circuitry when the data card is passed through the data card reader. The data card reader may be incorporated into a PCMCIA structure such as a PCMCIA card housing or guide/socket frame.

31 Claims, 2 Drawing Sheets

PORTABLE COMPUTER HAVING A DATA CARD READER APPARATUS ASSOCIATED THEREWITH

TECHNICAL FIELD OF THE INVENTION

The present invention is directed, in general, to personal computers having a data card reader apparatus associated therewith, and more specifically, to a portable computer having a PCMCIA application and data card reader apparatus associated therewith.

BACKGROUND OF THE INVENTION

The use of and advantages associated with portable computers are well known in the art. Over the last decade, there has been an intense effort in the computer industry to down size the personal computer ("PC") to provide users with a powerful yet portable computer that can be taken out of the office and fully utilized at home or on the road. As advancements have been made in both microprocessing chip and battery technologies, particularly over the last decade, PCs were eventually downsized into "laptop computers". While these computers offered the portability and processing power of a full sized PC, the laptop was still somewhat large and heavy for the user to carry around. In response to these disadvantages, the laptops were downsized even further into what is now commonly known in the industry as a notebook computer, which is smaller and more light weight yet possessing equal or greater processing capabilities than their earlier laptop counterpart.

In order to achieve a useful portable computer in the size of the notebook computers presently known in the art, many design processing and space saving changes occurred both in the electronics portion of the computer and in the exterior design. However, while the size of these portable computers has decreased, the expectations of the user with respect to the processing capacity and interfacing capabilities have expanded.

Thus, to accommodate this expanding need for a "super" portable computer, portable computer memory card international association ("PCMCIA") cards, which are small expansion modules each roughly the size and shape of a credit card, have been developed. These PCMCIA cards allow the user to temporarily expand the processing or interfacing capabilities of a portable computer with the insertion of a single card into the computer and interfacing it with the motherboard in the computer. Several different types of PCMCIA cards are presently available to portable computer users. These PCMCIA cards are often used in conjunction with a computer to easily, rapidly and interchangeably add various operational capabilities to the computer such as additional memory, enhanced video characteristics, networking or a fax/modem. For instance, some PCMCIA cards have been designed to allow the user to increase the RAM processing memory of the personal computer or interface the personal computer with varying types of Networks systems, such as Local Area Networks ("LAN"). Other PCMICA cards, alternatively, have been designed to operate as a modem or even has a supplemental hard disk drive. These and other various types of PCMCIA cards are now commercially available and extensively used.

Typically, a PCMCIA card is insertable through an exterior housing side wall slot of the computer into an interior housing card chamber within which a PCMCIA frame or connector having an ejector mechanism associated therewith is positioned. The inner end of the inserted card is forcibly plugged into and electrically connected with a complementary pin connector portion of PCMCIA connector that is, in turn, electrically connected in a conventional manner to the computer system planar or motherboard.

These portable, battery-powered computers have become increasingly popular over the last several years due to their light weight and small size that permit them to be easily hand-carried in an ordinary briefcase, yet with expanded capabilities. Business travelers, in particular, make advantageous use of such portable computers in cramped spaces, such as on airline seat back trays, lacking electrical plug-in facilities. In fact, a particularly small type of portable computer, the notebook computer, is very popular, generally having dimensions of 8.5"×11" and a weight of less than 8 pounds. Smaller still are the "subnotebook" computers and personal digital assistants ("PDAs") that have recently found public acceptance. For purposes of this discussion, "portable" is a generic term including, but not limited to, larger-than-notebook, notebook and subnotebook computers and PDAs.

The modern notebook computer typically employs a clamshell chassis that incorporates both hard and floppy disk drives, a visual display built into its lid portion, and a keyboard built into its main body portion. It is thus a fully self-contained computer able to be conventionally used, for limited periods of time, in situations and locations in which the use of a much larger desktop computer is simply not feasible.

As is well-known, however, even state-of-the-art portable computers have certain limitations and disadvantages, compared to their much larger desktop computer counterparts. For example, the compact keyboard of a portable computer is often considerably less comfortable to use for extended periods of time compared to the more spacious separate keyboards normally provided with desktop computers. Further, display size and clarity are frequently compromised in comparison to the cathode ray tubes associated with desktop computers. Additionally, while these computers are quite portable, they have had little application in the field of point-of-sale transactions due to their inability to electronically read a credit card or other coded cards, such as bar codes.

Another significant disadvantage of portable computers stems from their primary advantage: portability. Unlike their desktop counterparts, portable computers are freed from the confines of a relatively secure office environment and often brought into and temporarily laid down in public places, such as busy airports and restaurants. Thus, their exposure to the risk of theft is substantial. Further, their portability, high cost and ready re-marketability make them attractive targets for thieves.

In addition to their intrinsic value of the computer's hardware as electronic equipment, portable computers often contain far more valuable software, including owner-generated data. In stark contrast to other theft-prone equipment, such as car stereo equipment, portable computers thus also are attractive prey for thieves caring little about the computer's intrinsic hardware value, but intent on gaining access to the computer's sensitive software contents. These data thieves, perhaps in the form of an industrial spy or jealous coworker, would be substantially deterred from divesting the owner of the portable computer if access to the software therein was denied.

Thus, achieving security for a portable computer requires addressing both of these concerns, namely, substantially diminishing the computer hardware's intrinsic value to the common thief and severing access to the software contained therein to deter the more sophisticated criminal.

In the past, providing security for a portable computer was mostly limited to the latter concern: denying access to the software or data. Denial was generally carried out by password protection or encryption schemes. Protection from casual thievery was limited to providing lockable containers for containing the portable computer or leashes for securing the portable computer to a relatively immovable object, such as a desk. Unfortunately, these physical restraints tend substantially to diminish the portability, and thus a large part of the value, of the computer to the owner.

Accordingly, what is needed in the art is a way of not only securing a portable computer against both theft of the data stored therein without substantially hampering the utility of the computer to the owner, but also providing a way for the personal computers to read data from a data card so that information may be quickly transferred to the personal computer and so that they may serve as mobile point-of-sale terminals. The present invention provides an apparatus that addresses these needs.

SUMMARY OF THE INVENTION

To address the above-discussed deficiencies of the prior art, the present invention provides, in one embodiment, a personal computer, comprising a main chassis having an exterior wall defining, in part, an interior portion of the personal computer. The exterior wall, preferably has a PCMCIA aperture formed therein, which is configured to receive a conventional PCMCIA card therein and the interior portion contains data processing circuitry for processing data from a data card. The PCMCIA structure preferably has a first end with an opening therein configured to receive the data card therethrough and a second end having an electrical connector associated therewith for electrically connecting the PCMCIA structure to the personal computer. A data reader is also associated with the PCMCIA structure. In preferred embodiments, the data reader is capable of reading digital data, or optical data recorded on a data card.

More preferably, however, the data reader is a digital reader, such as those used to read a magnetic stripe in a low-density format on a credit card or an optical reader, such as those used to read bar codes. Associated with the data reader is a reading head configured to read the data card. This unique combination of components thus form a peripheral device for the personal computer to allow the data to be read into the data processing circuitry, which conveniently allows a personal computer user to electronically transmit the data directly from the data card to the computer for various purposes. Such purposes may include using data cards for remote point-of-sale transactions or using data cards to secure the data stored within the computer.

In one aspect of the embodiment just described, the PCMCIA structure is a PCMCIA card housing configured to be removably received in the PCMCIA aperture. The PCMCIA card housing is preferably a Type II or Type III PCMCIA device that may be received in a conventional PCMCIA frame that is positioned within the personal computer. In such embodiments, the data reader is incorporated within the interior portion of the PCMCIA card housing, preferably adjacent the PCMCIA structure's opening. This preferred positioning allows the data card to be accurately read. The data reader's incorporation into the PCMCIA card housing allows both the data reader and PCMCIA card housing to be easily removed from the personal computer when its use is complete. Since, the PCMCIA card housing is designed for easy removal from the personal computer by the user after the data has been transmitted to the personal computer, the PCMCIA aperture is accessible for conventional PCMCIA applications.

In yet another aspect of this embodiment, the PCMCIA structure is a guide/socket frame secured within the chassis and electrically connected to the processing circuitry within the personal computer. The guide/socket frame also includes an electrical connector for connecting a conventional PCMCIA card to the processing circuitry via the guide/socket frame. In this embodiment the guide/socket frame is preferably configured to receive a type II or type III PCMCIA device therein that can accommodate more than one PCMCIA card. As such, one slot may be used for conventional PCMCIA applications, while the remaining slot can be simultaneously used to read a data card.

In yet another aspect of this embodiment, the PCMCIA structure is a PCMCIA card having a conventional electrical socket or insertion pin connector end and an exterior end having a data reader electrically connected and mounted on the PCMCIA card. In this particular embodiment, the data reader is located exterior to the chassis when the PCMCIA card is fully positioned in the PCMCIA frame. This embodiment offers the same advantage as the embodiment that includes the PCMCIA card housing; that is, the PCMCIA card and thus the data reader can be easily removed from the PCMCIA frame after the data has been read by the reading head, thereby leaving the PCMCIA aperture accessible for conventional PCMCIA applications.

In another aspect of the present invention, the data reader further comprises a biased guiding member directly opposing the data reader within the PCMCIA structure. When the data card is inserted in the PCMCIA structure, the biased guiding member is positioned to urge the data card against the reading head to ensure an accurate read from the data card. The guiding member is preferably a plate with the biasing force preferably provided by a spring.

In another embodiment of the present invention, a personal computer comprising a main chassis with an exterior wall forming an interior portion of the personal computer is provided. The exterior wall has a PCMCIA aperture formed therein, which is preferably configured to receive either a PCMCIA card or data card, and the interior portion contains data processing circuitry therein for electronically processing a security data pattern from a data card. The personal computer also comprises a security system that includes a PCMCIA structure having a first end with an opening therein configured to receive the data card therethrough and a second end having an electrical connector associated therewith for electrically connecting the PCMCIA structure to the data processing circuitry for transmitting the security data pattern to the data processing circuitry. The PCMCIA structure further has a data reader associated therewith that has a reading head configured to read the security data card. As with the previously discussed embodiments, the data reader may be configured to read digital data or optical data. The security data pattern cooperates with the processing circuitry to enable normal operation of the personal computer when the security data pattern is read by the data reader.

In one aspect of the embodiment just described, the normal operation of the computer is enabled by comparing the security data security pattern with an identical data pattern associated with the processing circuitry. In another aspect, the security data pattern operates as decryption key, allowing the processing circuitry to decrypt data stored in the personal computer. Stated differently, the data card provides the encryption data that allows the personal computer to decrypt the data stored in the personal computer.

As with the other embodiments discussed above, the PCMCIA structure may be the removable PCMCIA card, the removable PCMCIA housing or the guide/socket frame that is secured within the interior portion of the chassis and electrically connected to the data processing circuitry. This embodiment may also comprise the biased guiding member discussed above for other embodiments.

The present invention provides yet another aspect that includes a method for transmitting data from a data card to a personal computer having a PCMCIA aperture therein. The method preferably comprises the steps of: passing a data card having data thereon through a data card reader that is electrically couplable to a PCMCIA structure that is electrically connectable to a data processing circuitry within the personal computer, the data card reader having a reading head configured to read the electronic data card and transmit the data to the data processing circuitry through the PCMCIA structure; reading the data with the data card reader; transmitting the data from the data card reader to the data processing circuitry within the personal computer via an end of the electronic data card reader electrically connectable to the data processing circuitry; and processing the data with the data processing circuitry. The method may involve the various apparatus above-discussed embodiments.

In another aspect of the method, the step of passing includes the step of passing the data card through the end of the PCMCIA structure. However, depending on the embodiment additional steps may also be present. For instance, in those embodiments that include the PCMCIA card housing, the step of passing includes the step of inserting the data card into the PCMCIA housing. In those embodiment that includes the guide/socket frame, the step of passing includes the step of inserting the data card into the guide/socket frame through the opening. Alternatively, where a PCMCIA card structure is present, the step of passing further the step of inserting the PCMCIA card in the PCMCIA aperture and electrically connecting the PCMCIA card to the personal computer. In such instances, the data reader is located exterior to the personal computer when the PCMCIA card is positioned in the PCMCIA aperture.

In the embodiment that includes a biased guiding member, the step of passing further includes the step of the biased guiding member urging the data card against the reading head when the data card is passed through the data card reader.

Regarding the security data embodiment, the step of reading further includes the step of reading a security data pattern from the data card and the step of processing further includes the step of the security data pattern cooperating with the processing circuitry to enable normal operation of the personal computer when the security data pattern is read by the data reader.

In another embodiment of the present invention, there is provided a personal computer comprising a main chassis having an exterior wall forming, in part, an interior portion of the personal computer. The exterior wall has a data card slot formed therein and is configured to receive a data card therethrough. The interior portion contains data processing circuitry for processing data recorded on a data card. A data card reader is positioned within the interior portion and has a reading head positioned adjacent a first end of the data card reader for linearly reading the data when the data card is received through the slot. Further, the data card reader has a second end electrically connectable to the data processing circuitry for transmitting the data to the data processing circuitry when the data card is passed through the data card reader.

Another aspect of this embodiment also provides an embodiment wherein the card slot is a PCMCIA aperture and the personal computer further comprises a PCMCIA structure having the data card reader associated with the PCMCIA structure. In other words, the data reader is positioned in relation to the PCMCIA structure such that the data reader reads the data card. The data reader may be structurally attached to the PCMCIA structure, or it may be separate from but aligned with the PCMCIA structure so that the data card is read when inserted in the PCMCIA structure. The PCMCIA structure has an open end for receiving the data card therein and a connector end electrically connectable to the data processing circuitry. The data card reader is electrically connectable to the data processing circuitry through the PCMCIA structure. As with the other embodiments discussed above, the PCMCIA structure may be the PCMCIA card housing, the PCMCIA card or the guide/socket frame discussed with respect to those other embodiments. Additionally, this embodiment may also include the biased guiding member discussed above with respect to those same embodiments.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
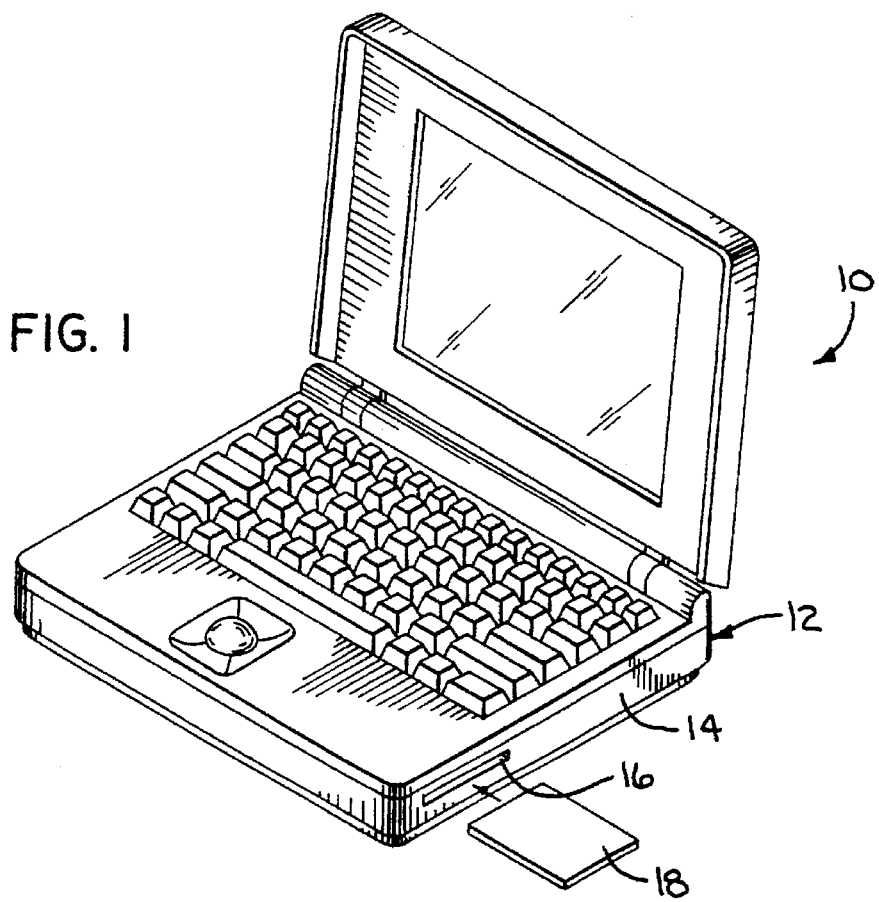
FIG. 1 illustrates a perspective view of a personal computer of the present invention having a data card slot formed in the chassis of the personal computer.

Referring initially to FIG. 1, in a preferred embodiment thereof, there is illustrated a personal computer 10 having a chassis 12 with an exterior wall 14 forming, in part, an interior portion of the personal computer 10. In a preferred embodiment, the personal computer 10 is a portable computer. However, it should be understood that the personal computer 10 may be other types of personal computers, such as desktops or personal digital assistants (PDA). The personal computer 10 contains data processing circuitry (not shown) for processing data recorded on a data card. The exterior wall 14 has a data card opening 16 formed therein, which is preferably a PCMCIA aperture configured to receive a conventional PCMCIA card or a data card 18 therethrough. As used herein, the data card 18 is a unitary substrate on which is located information that is in either magnetic readable or optical readable form. Such data cards are designed to be passed across a reading form in a substantially linear motion as opposed to conventional rotation motion associated with rotatable floppy, Winchester, or optical disks. Examples of such cards may include those containing a small length of magnetic tape adhered to at least one side of the card, such as ledger cards, identification badges, smart cards or credit cards. Alternatively, they may include cards having data readable through optical character recognition techniques, such as bar code data wherein the bar code data may be one-dimensional or two-dimensional.

Figure 2:
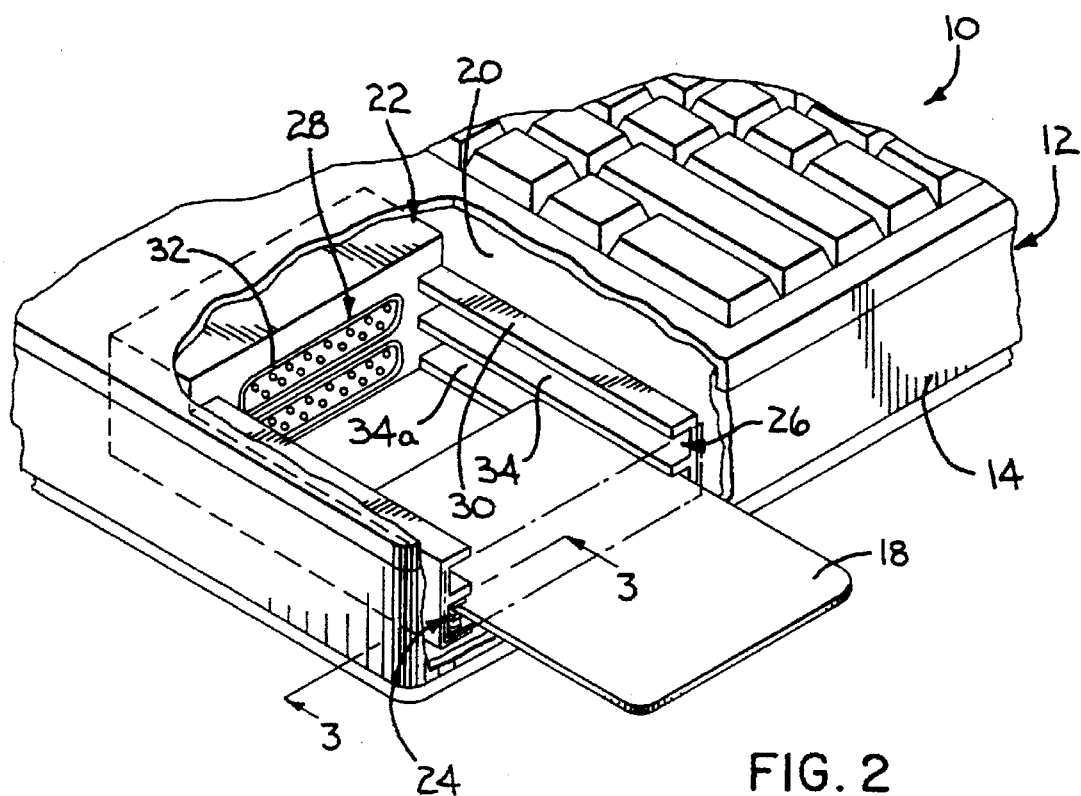
FIG. 2 illustrates a partial cut-away of the interior portion of the personal computer adjacent the data card slot with a data card partially inserted therethrough and into a PCMCIA structure of the present invention.

Turning now to FIG. 2, in a preferred embodiment thereof, there is illustrated a cut-away portion showing the interior portion 20 of the personal computer 10. The personal computer 10 further comprises a PCMCIA structure 22. As used herein, a PCMCIA structure is a structure that has application with conventional PCMCIA devices, such as conventional PCMCIA frames or cards. The PCMCIA structure 22 has a data card reader 24 associated with the PCMCIA structure 22; by associated, it is meant that the data card reader 24 is positioned in relation to the PCMCIA structure 22 such that the data card reader 24 accurately reads the data card 18 when the data card 18 is linearly passed by the data reader 18. The data card reader 24 may be attached to the structure of the PCMCIA structure 22 or may be separate from but aligned with the PCMCIA structure 22 so that the data card 18 is read when the data card 18 is linearly inserted in the PCMCIA structure 22. The PCMCIA structure 22 has an open end 26 for receiving the data card 18 therethrough and a connector end 28 electrically connectable to the data processing circuitry.

The data card reader 24 is electrically connectable to the data processing circuitry through the connector end 28 of the PCMCIA structure 22. The data card reader 24 is positioned within the PCMCIA structure 22, preferably adjacent the open end 26, for reading the data when the data card 18 is linearly inserted through the open end 26. The data card reader 24 may be a digital reader, such as those used to read a conventional magnetic stripe in a low-density format on a credit card or an optical reader, such as those used to read conventional bar codes. Thus, this invention provides a peripheral device for use with the personal computer 10 to allow data from the data card 18 to be read into the data processing circuitry, which conveniently allows the user to efficiently and electronically transmit the data directly from the data card 18 to the personal computer 10 for various applications. Such applications may include using the data card 18 to effect remote point-of-sale transactions or using the data card 18 to secure the data stored within the personal computer 10.

In a preferred embodiment, the PCMCIA structure 22 is preferably a guide/socket frame 30 secured within the chassis 12 and electrically connected to the processing circuitry within the personal computer 10. A PCMCIA card electrical connector 32 for connecting a PCMCIA card (not shown) to the processing circuitry is also included in the guide/socket frame 30. The PCMCIA card connector 32 may be either a conventional PCMCIA socket or a conventional PCMCIA pin configuration. In a more preferred embodiment, the guide/socket frame 30 is a type II or type III PCMCIA frame having more than one card slot 34 that can accommodate more than one PCMCIA card. As such, one card slot 34 may be used for conventional PCMCIA applications, such as receiving a PCMCIA card therein, while the remaining card slot 34a can be simultaneously used to read the data card 18. Of course, it will be appreciated that the guide/socket frame 30 may also have only one card slot for a single application.

Figure 3:
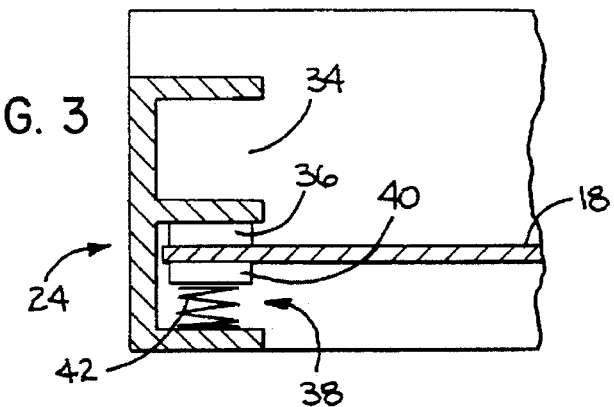
FIG. 3 illustrates a cross section view of FIG. 2 taken along the lines 3—3 with the data card being urged against the reading head by the biasing member.

Turning now to FIG. 3, there is illustrated a cross-sectional view of the data card reader 24 of FIG. 2 taken along the line 3—3. In a preferred embodiment, the data card reader 24 is comprised of a reading head 36. The reading head 36 may be a magnetic reading head capable of reading data cards such as those containing a small length of magnetic tape adhered to at least one side of the card, such as ledger cards, identification badges, smart cards or credit cards. Alternatively, it may be an optical reading head capable of reading data cards having data readable through optical character recognition techniques, such as bar code data wherein the bar code data may be one-dimensional or two-dimensional.

In a more preferred embodiment, however, the data reader 24 further comprises a biased guiding member 38 opposing the data reader 24 within the PCMCIA structure 22. When the data card 18 is inserted in the PCMCIA structure 22, the biased guiding member 38 urges the data card 18 against the reading head 36 to ensure an accurate read from the data card 18. The biased guiding member 38 is preferably a plate 40 with the biasing force preferably provided by a spring 42.

With the embodiment that includes the guide/socket frame 30 having now been described, a method of its operation will now be briefly discussed with general reference to FIGS. 2 and 3. The data card 18 is inserted into the card slot 34 having the data card reader 24 associated therewith. The data card 18 is linearly inserted with the side of the data card 18 containing the recorded data thereon facing the reading head 36. As the data card 18 is passed by the reading head 36, the reading head 36 reads the recorded data from the data card 18. The data is then transmitted to the processing circuitry in the personal computer 10. The data card 18 is linearly removed from the card slot 34 which leaves the guide/socket frame 30 available to receive conventional PCMCIA cards.

Figure 4:
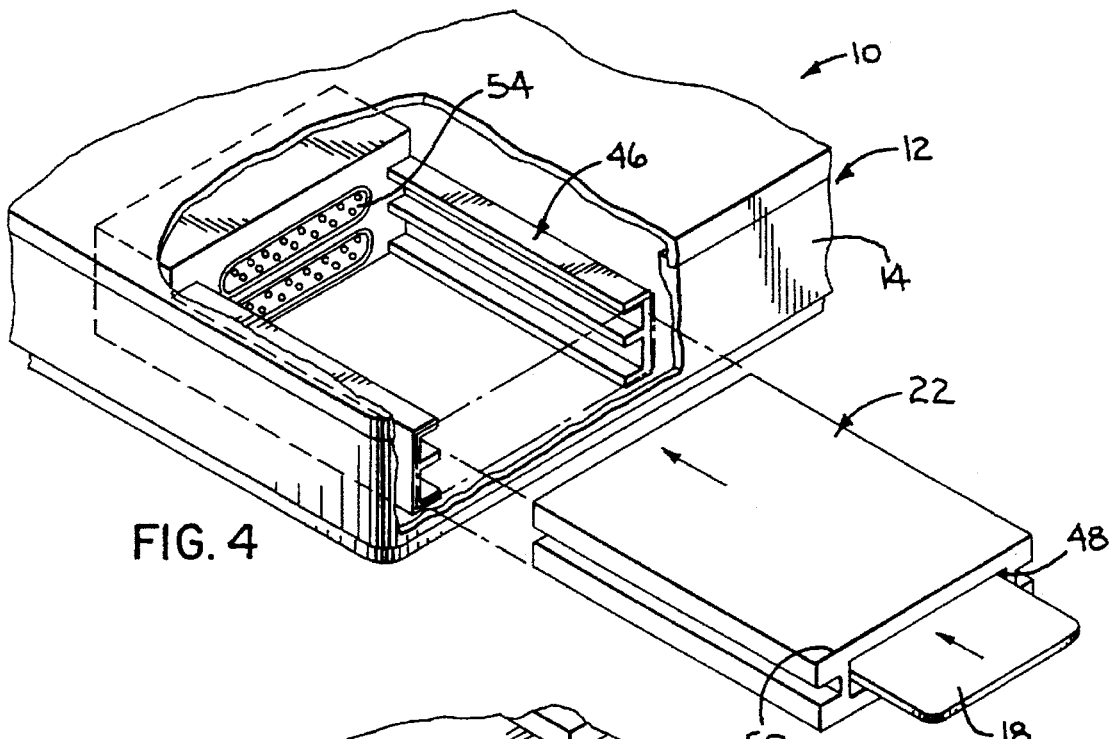
FIG. 4 illustrates an alternate embodiment comprising a removable PCMCIA card housing configured to be inserted in a PCMCIA frame.

Turning now to FIG. 4, there is illustrated an alternate embodiment of the PCMCIA structure 22. In this particular embodiment, the PCMCIA structure 22 is a PCMCIA card housing 44; that is, it is a data card housing configured to be removably received through the data card opening 16 and into a conventional PCMCIA frame 46. The PCMCIA card housing 44 has an opening 48 in its exterior end 50 that is configured to receive a data card 18 therein. The PCMCIA card housing 44 further has an insertion end 52 on which is positioned a conventional PCMCIA electrical socket or insertion pin connector (not shown). The electrical connector cooperatively engages a corresponding electrical connector 54 on the PCMCIA frame 46, which is electrically connected to the processing circuitry. When so engaged, the PCMCIA card housing 44 is electrically connected to the personal computer's processing circuitry. While the PCMCIA card housing 44 may be configured to be received by a conventional Type I PCMCIA frame, it is preferably configured to be received in conventional Type II or Type III PCMCIA frames. In this embodiment, the data reader (not shown) is incorporated within an interior portion of the PCMCIA card housing 44 in a similar fashion as illustrated in FIG. 2. The data reader is preferably positioned adjacent the PCMCIA card housing's opening 46 so that a complete read of the data card 18 can occur when it is inserted into the PCMCIA card housing 44. The PCMCIA card housing 44 is designed for easy removal from the personal computer 10 by the user after the data has been transmitted to the processing circuitry. This, of course, leaves the PCMCIA frame 46 accessible for conventional PCMCIA applications.

The method of operation is much the same as with the guide/socket frame 30 discussed above with respect to FIG. 2. However, the exception is that the PCMCIA housing 44 must first be inserted in the conventional PCMCIA frame 46 and electrically connected to the PCMCIA frame 46. The data card 18 is then inserted into the PCMCIA housing 44 such that the reading head accurately reads the data from the data card 18. Preferably, the biased guiding member discussed above with respect to FIGS. 2 & 3 is present in this embodiment and urges the data card 18 against the reading head. However, the biased guiding member is not essential in this particular embodiment. After the data card 18 has been read and the data transmitted to the processing circuitry, the data card 18 is removed from the PCMCIA card housing 44, and the PCMCIA card housing 44 is then removed from the PCMCIA frame 46 in the same way as conventional PCMCIA devices.

Figure 5:
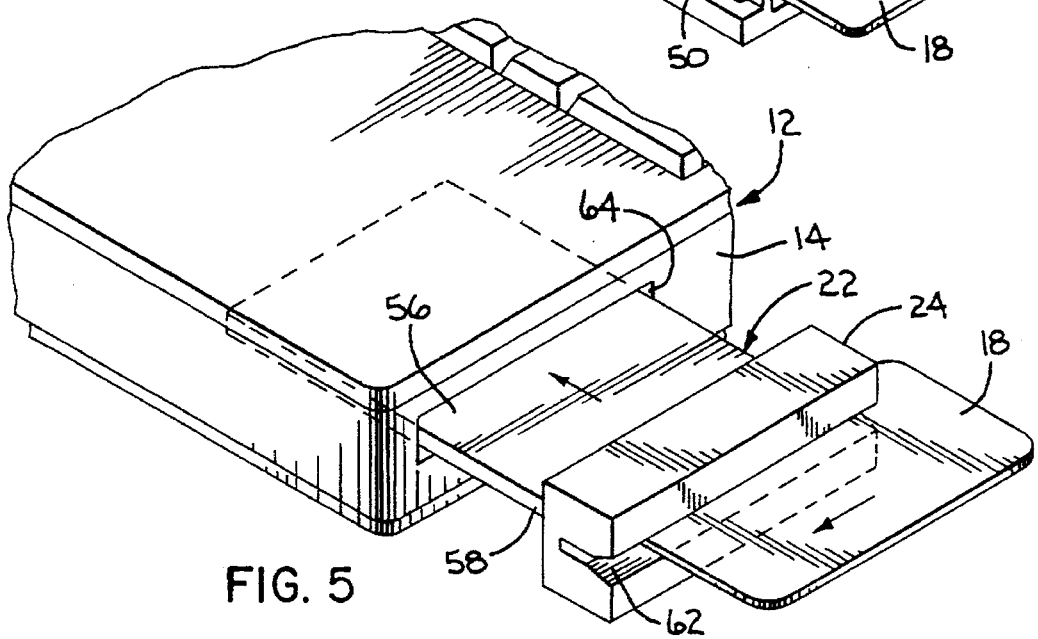
FIG. 5 illustrates an alternate embodiment of a PCMCIA card having a data card reader connected to an end of the PCMCIA card.

Turning now to FIG. 5, there is illustrated yet another embodiment of the present invention. In this embodiment, the PCMCIA structure 22 is a PCMCIA card 56 having a conventional connector socket or insertion pin end 58 and an exterior end 60 having a data card reader 24, as shown in FIGS. 2 and 3, electrically connected and mounted thereto. Preferably, the data reader 24 in this particular embodiment is a magnetic card reader configured to read a magnetic stripe on a credit card that has a data card slot 62 therethrough. Not shown, but positioned within the interior of the personal computer 10 is the previously discussed PCMCIA frame 46 as shown in FIG. 4. When the PCMCIA card 56 is received through a PCMCIA aperture 64 and fully inserted into the conventional PCMCIA frame 46, interior connector end 58 engages the PCMCIA electrical connector and electrically connects the PCMCIA card 56 with the processing circuitry of the personal computer 10. When the PCMCIA card 56 is fully inserted, the data card reader 24 is located exterior to the chassis 12. This embodiment offers the same advantage as the embodiment that includes the PCMCIA card housing 44; that is, the PCMCIA card 56 and thus the data card reader 24 can be easily removed from the PCMCIA aperture 64 after the data has been read by the reading head, thereby leaving the PCMCIA aperture accessible for conventional PCMCIA applications.

Referring now generally to FIG. 2, in another aspect of the present invention, the personal computer 10 also comprises a security system that includes the cooperation of the previously discussed PCMCIA structure 22 with the data processing circuitry of the personal computer 10. The data processing circuitry is designed for electronically processing a security data pattern recorded on the data card 18. The open end 26 in the PCMCIA structure 22 is configured to receive the data card 18 therethrough and the connector end 28 has an electrical connector 32 associated therewith for electrically connecting the PCMCIA structure 22 to the data processing circuitry for transmitting the security data pattern to the data processing circuitry. The reading head 36 of the data card reader 24 is configured to read the security data card. As was the case with previously discussed embodiments, the data card reader 24 can read digital data or optical data and the security data can be magnetically or optically recorded thereon. The security data pattern cooperates with the processing circuitry to enable normal operation of the personal computer when the security data pattern is read by the data reader. The normal operation of the personal computer 10 is enabled by the processing circuitry electronically comparing the security data security pattern with an identical data pattern associated with processing circuitry. It should, of course, be understood that the present invention may embody a sequence of software instructions executable by a general purpose processor, such as the personal computer's 10 microprocessor. In one aspect, various predetermined security patterns that are identical to the security data on the data card 18 may be stored in the processing circuitry or other memory circuitry electrically coupled to the processing circuitry. In such instances, if the security data that is read from the data card is identical to the security data stored in the processing circuitry, then the personal computer 10 will be operable.

In another aspect, the security data pattern recorded on the data card 18 operates as a decryption key, allowing the processing circuitry to decrypt data stored in the personal computer. In such instances, the data card provides the encryption data that allows the personal computer to decrypt the data stored in the personal computer so that the data stored in the personal computer 10 may be decrypted.

The PCMCIA structure 22 used in this particular embodiment may encompasses all of the same varying embodiments as previously discussed, i.e., the PCMCIA structure may be a PCMCIA card housing, a guide/socket frame or a PCMCIA card.

The present invention also includes a method for transmitting data from a data card to a personal computer having a PCMCIA aperture therein. The method preferably comprises the steps of: passing a data card having data thereon through a data card reader that is electrically couplable to a PCMCIA structure that is electrically connectable to a data processing circuitry within the personal computer, the data card reader having a reading head configured to read the electronic data card and transmit the data to the data processing circuitry through the PCMCIA structure; reading the data with the data card reader; transmitting the data from the data card reader to the data processing circuitry within the personal computer via an end of the electronic data card reader electrically connectable to the data processing circuitry; and processing the data with the data processing circuitry. This method, of course, may involve the various apparatus discussed above.

In another aspect of the method, the step of passing includes the step of passing the data card through the end of the PCMCIA structure. Where a PCMCIA card housing is present, the step of passing includes the step of inserting the PCMCIA housing into the PCMCIA frame and linearly inserting the data card into the PCMCIA housing. Where a guide/socket frame is present, the step of passing includes the step of inserting the data card into the guide/socket frame through the opening. Alternatively, where a PCMCIA card structure is present, the step of passing further includes the step of inserting the PCMCIA card in the PCMCIA aperture and electrically connecting the PCMCIA card to the personal computer. In such instances, the data reader is located exterior to the personal computer when the PCMCIA card is positioned in the PCMCIA aperture.

In the embodiments that include a biased guiding member, the step of passing further includes the step of the biased guiding member urging the data card against the reading head when the data card is passed through the data card reader.

Where the security data pattern is present, the step of reading further includes the step of reading a security data pattern from the data card and the step of processing further includes the step of the security data pattern cooperating with the processing circuitry to enable normal operation of the personal computer when the security data pattern is read by the data reader.

From the above description, it is apparent that the present invention provides a personal computer comprising a main chassis having an exterior wall forming, in part, an interior portion of the personal computer. The exterior wall has a data card slot formed therein and is configured to receive a data card therethrough. The interior portion contains data processing circuitry for processing data recorded on a data card. A data card reader is positioned within the interior portion and has a reading head positioned adjacent a first end of the data card reader for linearly reading the data when the data card is received through the slot. Further, the data card reader has a second end electrically connectable to the data processing circuitry for transmitting the data to the data processing circuitry when the data card is passed through the data card reader. The data card reader may be incorporated into a PCMCIA structure such as a PCMCIA card housing or guide/socket frame.

Although the present invention and its advantages have been described in detail, those skilled in the art should understand that they can make various changes, substitutions and alterations herein without departing from the spirit and scope of the invention in its broadest form.

What is claimed is:

1. A personal computer, comprising:
   a main chassis having an exterior wall defining, in part, an interior portion of said personal computer, said exterior wall having a PCMCIA (Portable Computer Memory Card International Association) aperture formed therein and said interior portion containing data processing circuitry for and processing data recorded on a data card;
   a PCMCIA structure having a first end with an opening therein configured to receive said data card therethrough and a second end having an electrical connector associated therewith for electrically connecting said PCMCIA structure to said personal computer, said PCMCIA structure receivable in said PCMCIA aperture and further having a data reader integrally formed therein, said data reader having a reading head configured to read said data card, said data reader thereby forming an integrated device for said personal computer to allow said data to be read into said data processing circuitry when received in said PCMCIA structure.

2. The personal computer of claim 1 wherein said data reader is a digital reader.

3. The personal computer of claim 2 wherein said data reader is a magnetic stripe reader.

4. The personal computer of claim 1 wherein said data reader is an optical reader.

5. The personal computer of claim 1 wherein said PCMCIA structure is a PCMCIA card housing configured to be removably received in said PCMCIA aperture, said data card reader incorporated within an interior portion of said PCMCIA structure and electrically connectable to said data processing circuitry through said PCMCIA housing.

6. The personal computer of claim 1 wherein said PCMCIA structure is a guide/socket frame secured within said interior portion and electrically connected to said data processing circuitry, said guide/socket frame having a PCMCIA card connector for electrically connecting said PCMCIA card to said processing circuitry.

7. The personal computer of claim 6 further comprising a PCMCIA card having an electrical connector end and an exterior end having a magnetic stripe reader electrically connected to and mounted on said PCMCIA card, said PCMCIA card removably insertable through said PCMCIA aperture and in said guide/socket frame to electrically connect said PCMCIA card to said guide/socket frame, said magnetic stripe reader located exterior to said personal computer when said PCMCIA card is positioned in said PCMCIA aperture.

8. The personal computer of claim 1 wherein said data reader further comprises a biased guiding member opposing said data reader within said PCMCIA structure, said biased guiding member urging said data card against said reading head when said data card is inserted in said PCMCIA structure.

9. The personal computer of claim 1 wherein said PCMCIA aperture is configured to receive a PCMCIA card therein.

10. The personal computer of claim 1 wherein said data card is selected from the group consisting of:
   a credit card having a magnetic stripe thereon; and
   a card having a bar code printed thereon wherein said bar code is one-dimensional or two-dimensional.

11. The personal computer of claim 1 wherein said PCMCIA structure is configured to receive a PCMCIA card or a data card therein.

12. A personal computer, comprising:
   a main chassis with an exterior wall forming an interior portion of said personal computer, said exterior wall having a PCMCIA (Portable Computer Memory Card International Association) aperture formed therein and said interior portion containing data processing circuitry for electronically processing a security data pattern recorded on a data card; and
   a security system including a PCMCIA structure having a first end with an opening therein configured to receive said data card therethrough and a second end having an electrical connector associated therewith for electrically connecting said PCMCIA structure to said data processing circuitry for transmitting said security data pattern to said data processing circuitry, said PCMCIA structure receivable in said PCMCIA aperture and further having a data reader integrally formed therein, said dam reader having a reading head configured to read said dam card, said security dam pattern cooperating with said processing circuitry to enable normal operation of said personal computer when said PCMCIA structure is received in said PCMCIA aperture and said security data pattern is read by said data reader.

13. The personal computer of claim 12 wherein said PCMCIA structure is a PCMCIA card having a first end receivable in said PCMCIA aperture and a second exterior end, said PCMCIA card further having a magnetic stripe reader electrically connected and mounted to said PCMCIA card adjacent said second exterior end, said magnetic stripe reader located exterior to said chassis when said PCMCIA card is fully positioned in said PCMCIA aperture.

14. The personal computer of claim 12 wherein said data card reader is a digital reader.

15. The personal computer of claim 12 wherein said data card reader is an optical reader.

16. The personal computer of claim 12 further comprising a biased guiding member opposing said reader head, said biased guiding member urging said data card against said reader head as said data card is inserted in said opening of said data card reader.

17. The personal computer of claim 12 wherein said PCMCIA structure is a PCMCIA card housing configured to be removably received in said PCMCIA aperture, said data card reader incorporated within an interior portion of said PCMCIA structure and electrically connectable to said data processing circuitry through said PCMCIA housing.

18. The personal computer of claim 12 wherein said PCMCIA structure is a guide/socket frame secured within said interior portion and electrically connected to said data processing circuitry, said guide/socket frame having a PCMCIA card connector for electrically connecting said PCMCIA card to said processing circuitry.

19. The personal computer of claim 18 further comprising a PCMCIA card having an electrical connector end and an exterior end having a magnetic stripe reader electrically connected to and mounted on said PCMCIA card, said PCMCIA card removably insertable through said PCMCIA aperture and in said guide/socket frame to electrically connect said PCMCIA card to said guide/socket frame, said magnetic stripe reader located exterior to said personal computer when said PCMCIA card is positioned in said PCMCIA aperture.

20. The personal computer of claim 12 wherein said PCMCIA aperture is configured to receive a PCMCIA card or a data card therein.

21. The personal computer of claim 12 wherein said data card is selected from the group consisting of:

a card having a magnetic stripe thereon; and a card having a bar code printed thereon wherein said bar code is one-dimensional or two-dimensional.

22. A method for transmitting data from a data card to a personal computer having a PCMCIA (Portable Computer Memory Card International Association) aperture therein, comprising the steps of:

passing a data card having data recorded thereon through an opening in a first end of a PCMCIA structure, said PCMCIA structure having a data card reader therein, said PCMCIA structure receivable in said PCMCIA aperture and electrically connectable to a data processing circuitry within said personal computer when received in said PCMCIA aperture, said data card reader having a reading head configured to read said electronic data card and transmit said data to said data processing circuitry through said PCMCIA structure;

passing said data card by said data card reader to read said data card;

reading said data with said data card reader;

transmitting said data from said data card reader to said data processing circuitry within said personal computer via an end of said electronic data card reader; and processing said data with said data processing circuitry.

23. The method of claim 22 wherein said PCMCIA structure is a PCMCIA card housing configured to be removably received in said PCMCIA aperture, said data card reader incorporated within an interior portion of said PCMCIA structure and electrically connectable to said data processing circuitry through said PCMCIA housing, and said step of passing includes the step of inserting said data card into said PCMCIA housing through said opening.

24. The method of claim 22 wherein said PCMCIA structure is a guide/socket frame secured within said interior portion and electrically connected to said data processing circuitry, said guide/socket frame having a PCMCIA card connector for electrically connecting said PCMCIA card to said processing circuitry, and said step of passing includes the step of inserting said data card into said guide/socket frame through said opening.

25. The method of claim 23 further comprising a PCMCIA card having an electrical connector end and an exterior end having a magnetic stripe reader electrically connected to and mounted on said PCMCIA card, said PCMCIA card removably insertable through said PCMCIA aperture and in said guide/socket frame to electrically connect said PCMCIA card to said guide/socket frame, and said method further includes the step of inserting said PCMCIA card in said PCMCIA aperture and electrically connecting said PCMCIA card to said personal computer, said magnetic stripe reader located exterior to said personal computer when said PCMCIA card is positioned in said PCMCIA aperture.

26. The method of claim 22 wherein said data card reader is a digital reader.

27. The method of claim 22 wherein said data card reader is an optical reader.

28. The method of claim 22 wherein said data card reader further comprises a biased guiding member opposing said reading head, and wherein said step of passing includes the step of said biased guiding member urging said data card against said reading head when said data card is passed through said data card reader.

29. The method of claim 22 wherein said PCMCIA aperture is configured to receive a PCMCIA card or a data card therein.

30. The method of claim 22 wherein said data card is selected from the group consisting of:

a card having a magnetic stripe thereon; and a card having a bar code printed thereon wherein said bar code is one-dimensional or two-dimensional.

31. The method of claim 22 wherein said step of reading further includes the step of reading a security data pattern from said data card and said step of processing further includes the step of said security data pattern cooperating with said processing circuitry to enable normal operation of said personal computer when said security data pattern is read by said data reader.

* * * * *

UNITED STATES PATENT AND TRADEMARK OFFICE
CERTIFICATE OF CORRECTION

PATENT NO. : 5,625,534
DATED : April 29, 1997
INVENTOR(S) : Okaya, et al.

It is certified that error appears in the above-indentified patent and that said Letters Patent is hereby corrected as shown below:

Col. 12, line 45 "dam" should be --data--; and

Col. 12, line 46 both occurrences of "dam" should be --data--.

Signed and Sealed this

Twenty-seventh Day of January, 1998

Attest:

BRUCE LEHMAN

Attesting Officer     Commissioner of Patents and Trademarks